(12) United States Patent
D'Aquino et al.

(10) Patent No.: US 11,022,629 B2
(45) Date of Patent: Jun. 1, 2021

(54) LOW-GLITCH RANGE CHANGE TECHNIQUES

(71) Applicant: Analog Devices, Inc., Norwood, MA (US)

(72) Inventors: Stefano I. D'Aquino, Westford, MA (US); Jennifer W. Pierdomenico, Temple, PA (US); Edward L. Collins, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 111 days.

(21) Appl. No.: 16/525,257

(22) Filed: Jul. 29, 2019

(65) Prior Publication Data

US 2021/0033644 A1    Feb. 4, 2021

(51) Int. Cl.
*G01R 1/30* (2006.01)
*H03F 3/45* (2006.01)

(52) U.S. Cl.
CPC ............ *G01R 1/30* (2013.01); *H03F 3/45475* (2013.01); *H03F 2200/129* (2013.01); *H03F 2203/45116* (2013.01)

(58) Field of Classification Search
CPC .......... G01R 1/30; H04B 1/707; H04B 1/713; H04B 1/413; G01S 11/08; G01S 5/12
See application file for complete search history.

(56) References Cited

U.S. PATENT DOCUMENTS

| | | | |
|---|---|---|---|
| 3,529,244 A | 9/1970 | Torick et al. | |
| 4,039,981 A | 8/1977 | Ohashi et al. | |
| 4,119,922 A | 10/1978 | Schroder | |
| 5,602,510 A | 2/1997 | Bayruns et al. | |
| 5,675,656 A | 10/1997 | Sondermeyer et al. | |
| 6,307,433 B1 | 10/2001 | Ikeda | |
| 6,507,223 B2 | 1/2003 | Felder | |
| 7,176,757 B2 | 2/2007 | Nakatani | |
| 7,545,209 B2 | 6/2009 | Hughes | |
| 7,633,337 B2 | 12/2009 | Nam et al. | |
| 7,772,813 B2 | 8/2010 | Kojima et al. | |
| 7,944,291 B2 | 5/2011 | Jung et al. | |
| 2003/0222709 A1 | 12/2003 | Kim | |

(Continued)

FOREIGN PATENT DOCUMENTS

| EP | 1521360 A1 | 4/2005 |
|---|---|---|
| EP | 2317644 A1 | 5/2011 |

(Continued)

*Primary Examiner* — Dominic E Hawkins
(74) *Attorney, Agent, or Firm* — Schwegman Lundberg & Woessner, P.A.

(57) ABSTRACT

Techniques are provided for changing a range of an output circuit with little or no voltage or current glitch. In an example, a method of changing a range of an output signal can include providing a first level of the output signal at an output of a first amplifier based on a received setpoint signal and receiving a range change command. In response to the range change command an input of a second amplifier can be shorted to an output of the second amplifier for a first interval. At the end of the first interval and over a second interval, a first impedance between the input of the second amplifier and the output of the second amplifier can be increased, and a second impedance between the input of the second amplifier and the setpoint signal can be increased.

20 Claims, 12 Drawing Sheets

(56) References Cited

U.S. PATENT DOCUMENTS

| | | | |
|---|---|---|---|
| 2005/0259186 A1* | 11/2005 | Mehr | H03G 3/3052 |
| | | | 348/731 |
| 2011/0095817 A1* | 4/2011 | Yamada | H03F 1/52 |
| | | | 330/98 |
| 2014/0070889 A1 | 3/2014 | Chen et al. | |
| 2014/0142447 A1 | 5/2014 | Takahashi et al. | |
| 2014/0184337 A1 | 7/2014 | Nobbe et al. | |
| 2014/0312976 A1* | 10/2014 | Noori | H03F 3/195 |
| | | | 330/295 |
| 2018/0269844 A1 | 9/2018 | Jing et al. | |

FOREIGN PATENT DOCUMENTS

| | | |
|---|---|---|
| JP | 2006245843 A | 9/2006 |
| JP | 2011217226 A | 10/2011 |

* cited by examiner

LOW-GLITCH RANGE CHANGE TECHNIQUES

TECHNICAL FIELD OF THE DISCLOSURE

The present disclosure is related to providing output signals and more particularly to limiting disturbances or glitches when changing a range of an output signal.

BACKGROUND

Manufacturers often rely on test equipment to verify products as well as the processes use to make the products are operating as expected. Test equipment can provide or simulate a variety of conditions including, but not limited to, electrical, mechanical, and environmental. Electrical testing can involve delivering a variety of electrical signals directly or via radiated signals to a product and observing the products response. Mechanical testing can apply a variety of mechanical torque stress or shocks to a device and observe the products response. Environmental testing can subject a product to various temperatures, chemicals, pressures, etc. and observe the products response. The data collected from such testing can be evaluated to define the products performance and compare such performance with expectations. Variations can be used to detect superior or inferior design or manufacturing techniques. Unpredictable performance or glitches in applied test conditions can undermine the validity of test results.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
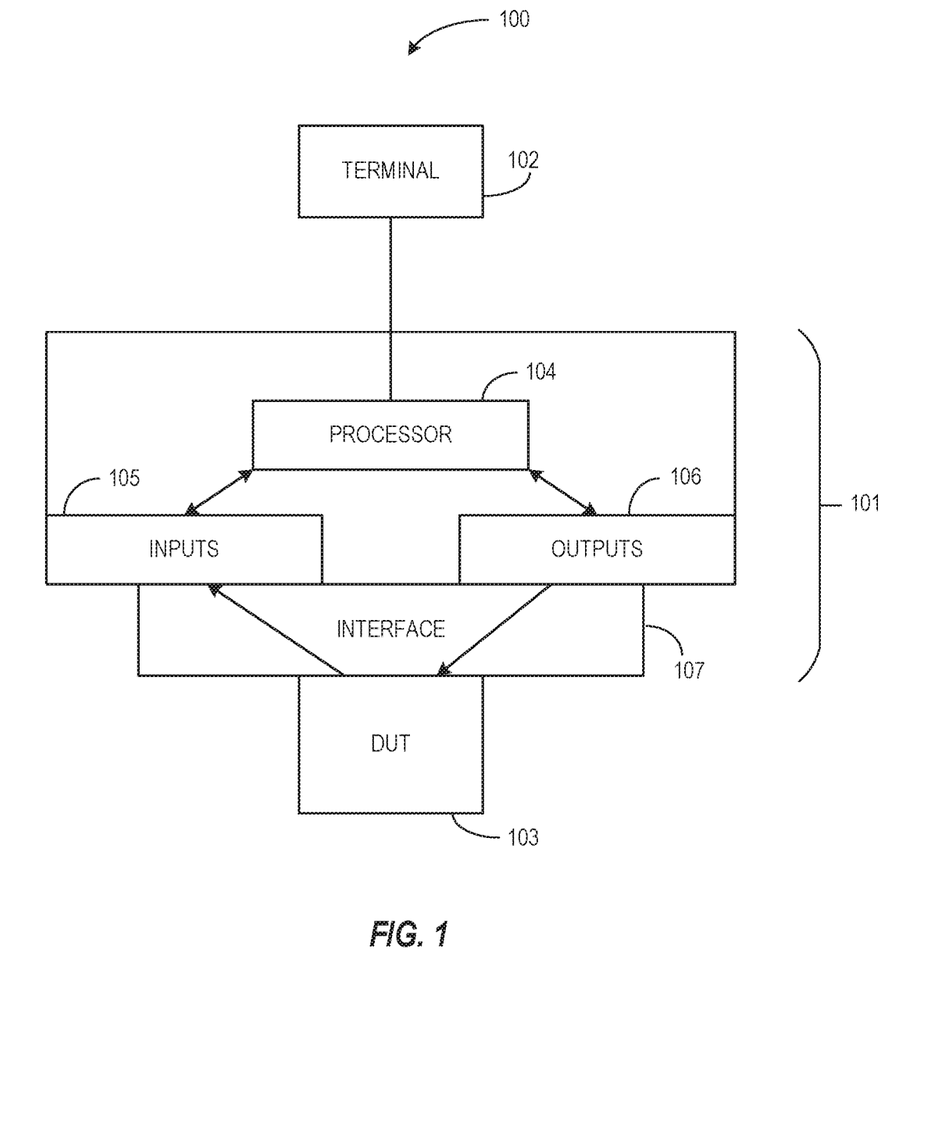
FIG. 1 illustrates generally an example system according to the present subject matter.

The present inventors have recognized techniques for changing a range of an output on-the-fly with little or no glitch. Such techniques can be applicable to test equipment, for example, but are not so limited. FIG. 1 illustrates generally an example system 100 according to the present subject matter. The system 100 can include a piece of test equipment 101, a terminal 102 which may or may not be part of the piece of test equipment, and a device under test (DUT) 103. The piece of test equipment 101 can include processing circuitry 104, one or more inputs 105, one or more outputs 106, and an optional interface 107. The processing circuitry 104 can receive test procedures, execute the test procedures, monitor certain conditions of the DUT 103 while the test procedures are executed, and provide test information about the performance of the test procedures and the DUT 103. The terminal 102 can be used to program the test procedures, monitor execution of the processing circuitry 104, and display the test information. The inputs 105 and outputs 106 can provide test signals to the DUT 103 and can receive monitoring signals from the DUT 103. The optional interface 107 can allow the single piece of test equipment 101 to be used with more than one physical format of a product. In some examples, the interface 107 can provide routing for electrical input and output signals between terminals of the DUT 103 and terminals of piece of test equipment 101. In some examples, the interface 107 can also include devices to control and apply environmental conditions to the MIT 103, such as heat or cooling.

Figure 2:
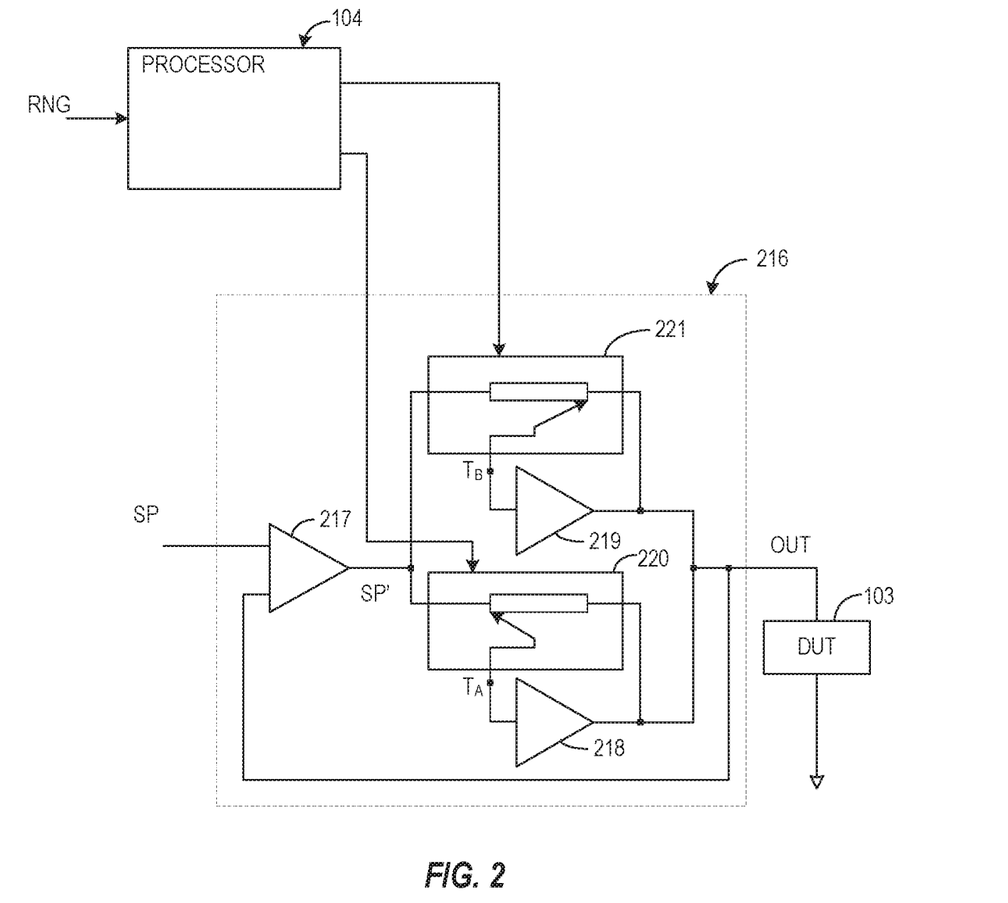
FIG. 2 illustrates generally an example output circuit of a piece of test equipment.

FIG. 2 illustrates generally an example output circuit 216 of a piece of test equipment. In practice, a piece of test equipment can often have a number of output circuits. The output circuit 216 can receive one or more signals from the processing circuit including, but not limited to, a setpoint (SP) control signal or a range selection control signal (RNG). The output circuit 216 can include an error amplifier, or force amplifier 217, and two or more range amplifier buffers 218, 219. For purposes of illustration, the setpoint (SP) can be a voltage setpoint and the range amplifier buffers 218, 219 can be transconductance amplifiers. It is understood that using amplifiers or buffers other than a transconductance amplifier is possible without departing from the scope of the present subject matter. The force amplifier 217 can receive a representation of a desired voltage at the output node (OUT) of the output circuit 216 and can increase or decrease current to the output node (OUT) via one of the amplifier buffers 218, 219. For illustrative purposes, a first amplifier buffer 218 can provide current over a range from 0 to 100 milliampere (mA) and a second amplifier buffer 219 can provide current over a range from 0 to 1 ampere (A). When the first amplifier buffer 218 is enabled and providing maximum current to the DUT 103, a voltage can develop across the first amplifier buffer 218. Likewise, when the second amplifier butler 219 is enabled and providing the maximum current of the first amplifier buffer 218, a voltage can develop across the second amplifier buffer 219.

Generally, the voltage across the first amplifier buffer 218 and the voltage across the second amplifier buffer 219 for a given error signal is not going to be the same. As such, if the range selection control scheme merely turns one of the output amplifier buffers on while switching the other amplifier buffer off to execute a range change, a voltage glitch can be developed across the DUT 103 because of the difference in voltage across the two output amplifier buffers 218, 219. To solve this problem, an example technique implements an impedance device 220, 221 across each output amplifier buffer 218, 219 and a range change method to achieve a range change with little or no glitch. Each impedance device 220, 221 can include a large impedance string coupled between the command signal (e.g., output of the force amplifier 217) for the amplifier buffers 218, 219 and the output of each amplifier buffer 218, 219. A second impedance string of each impedance device 220, 221 can be controlled by the processing circuitry 104 to gradually change the impedance between the command signal and the input of the amplifier buffer and the impedance between the input of the amplifier buffer and the output of the amplifier buffer. Thus, each impedance device can include an input for receiving the command signal, an output for coupling with the output of the respective amplifier buffer, and a variable tap for coupling with the input of the respective amplifier buffer.

Figure 3A:
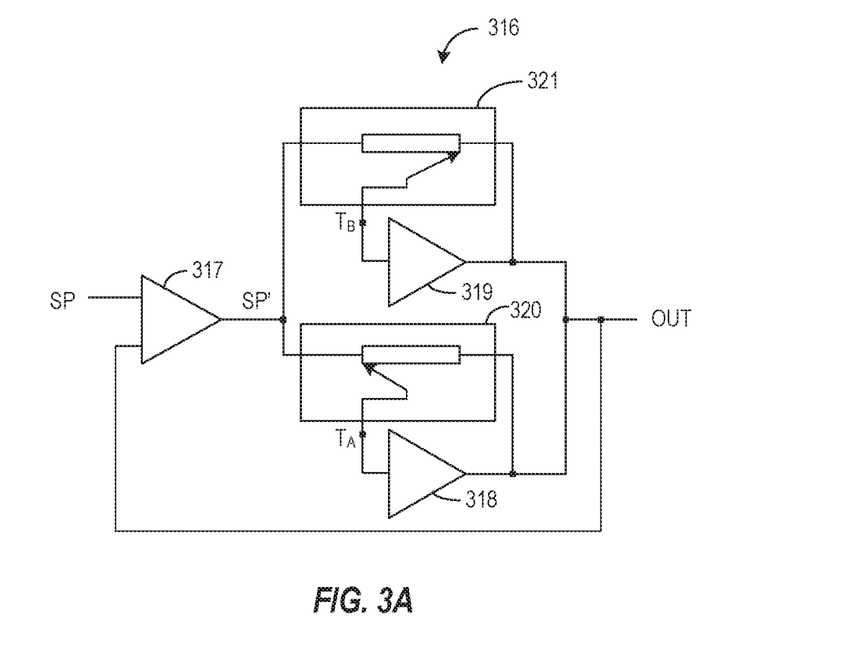
FIG. 3A-FIG. 3F illustrate generally a method for executing a range change of an output circuit according to the present subject matter.

FIG. 3A-FIG. 3F illustrate generally a method for executing a range change of an output circuit 316 according to the present subject matter. FIG. 3A-3F illustrate at least a portion of an example output circuit 316 including a force amplifier, a first output amplifier buffer, a second output amplifier buffer, a first impedance device and a second impedance device. FIG. 3A illustrates generally a state of the output circuit prior to changing the range of the output circuit 316. At FIG. 3A, the first output amplifier buffer 318 is enabled and providing current to the DUT (not shown), and the second output amplifier buffer 319 is disabled or is about to be enabled to change the range of the output circuit 316. As such, the variable tap of the first impedance device 320 is directly connected or shorted to the command signal, or output of the force amplifier 317, and the variable tap of the second impedance device 321 is directly connected to the output note of the second amplifier buffer 319 such that the output impedance of the second amplifier buffer 319 is very large and does not affect the operation of the first amplifier buffer 318.

Figure 3B:
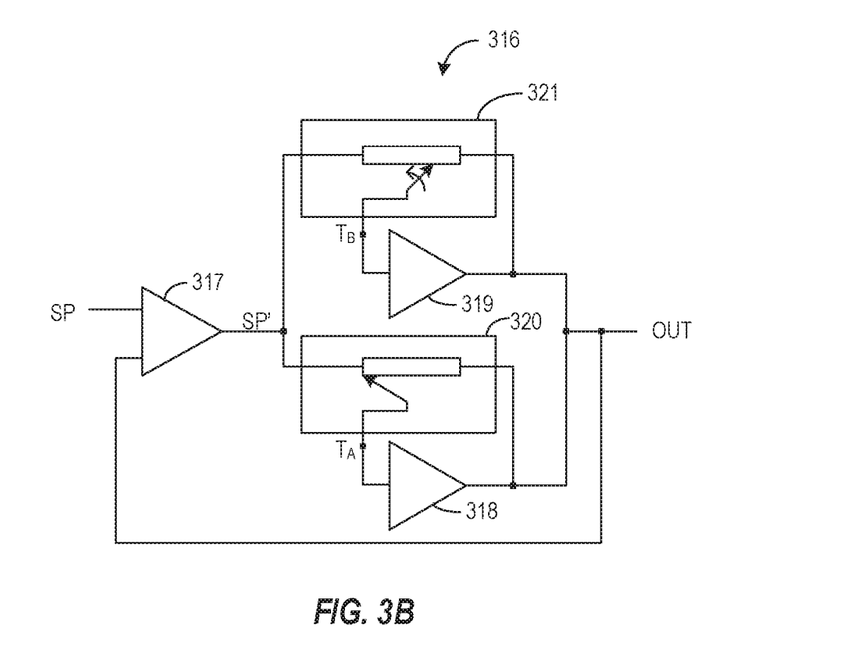

FIG. 3B illustrates generally a first state of the output circuit 316 during a range change. While reaching this first state of the range change, the first impedance device 320 continues to directly connect the input of the first amplifier buffer 318 with the output of the force amplifier 317 while also maintaining a high impedance between the input of the first amplifier buffer 318, via the variable tap, and the output of the first amplifier buffer 318. After the range change begins, the second impedance device 321 can be controlled to begin to increase the impedance between the variable tap and the output of the second amplifier buffer 319 while also decreasing the impedance between the variable tap and the output of the force amplifier 317. For the example shown in FIG. 2, the current provided to the DUT can begin to be sourced by both the first amplifier buffer 318 and the second amplifier buffer 319. Additionally, the voltage across the first amplifier buffer 318 and the voltage across the second amplifier buffer 319 can be the same.

Figure 3C:
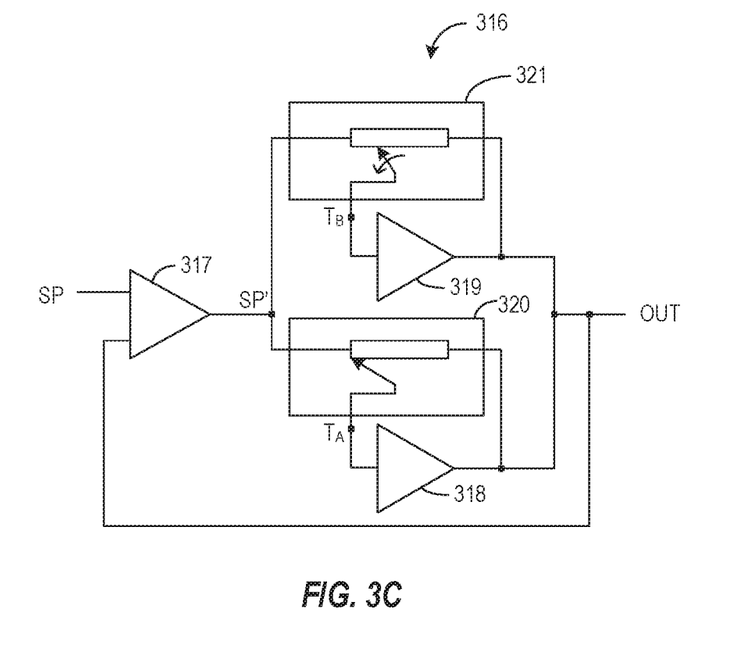

FIG. 3C illustrates generally a second state of the output circuit 316 during the range change. While reaching this second state of the range change, the first impedance device 320 continues, via the variable tap, to directly connect the input of the first amplifier buffer 318 with the output of the force amplifier 317 while also maintaining a high impedance between the input of the first amplifier buffer 318 and the output of the first amplifier buffer 318. The second impedance device 321 can continue to be controlled to increase the impedance between the variable tap and the output of the second amplifier buffer 319 while also decreasing the impedance between the variable tap and the output of the force amplifier 317.

Figure 3D:
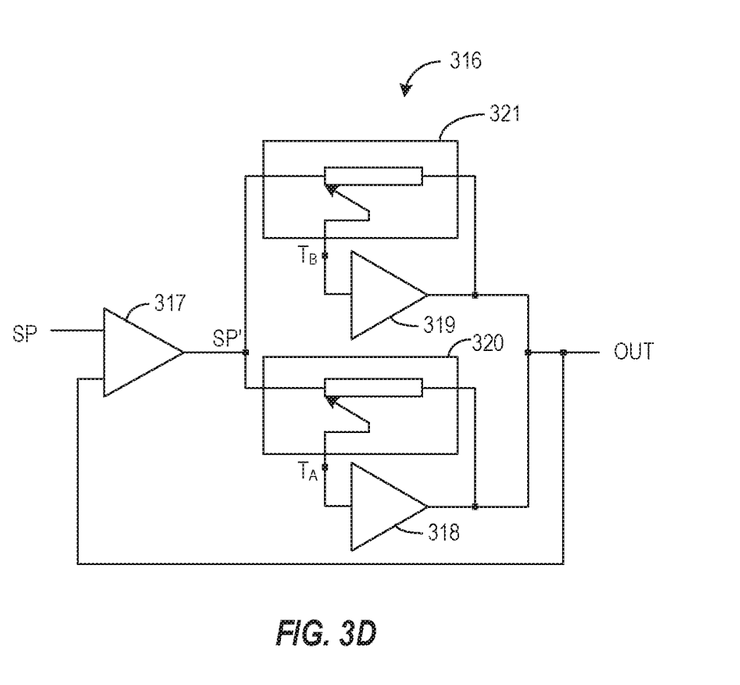

FIG. 3D illustrates generally a third state of the output circuit 316 during the range change. While reaching this third state of the range change, the first impedance device 320 continues to directly connect, via the variable tap ($T_A$), the input of the first amplifier buffer 318 with the output of the force amplifier 317 while also maintaining a high impedance between the input of the first amplifier buffer 318 and the output of the first amplifier buffer 318. The second impedance device 321 can now directly connect the output of the force amplifier 317 with the input of the second amplifier buffer 319 and can isolate the variable tap ($T_B$) from the output of the second amplifier buffer 319 with a relatively high impedance. The first and second amplifier buffers 318, 319 can share sourcing the appropriate current to the DUT via the output terminal (OUT) of the output circuit 316 at the third state of the range change.

Figure 3E:
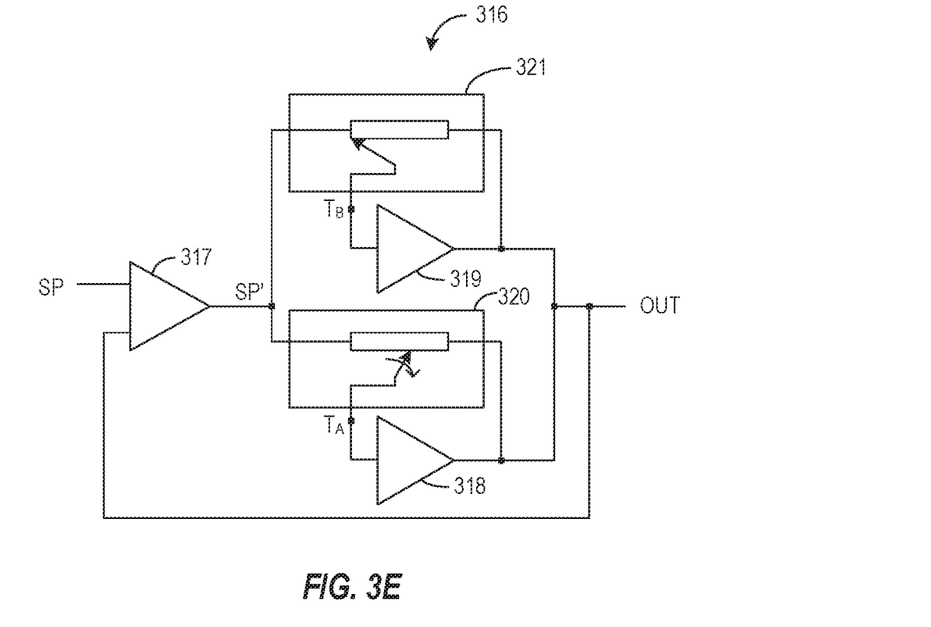

FIG. 3E illustrates generally a fourth state of the output circuit 316 during the range change. While reaching this fourth state of the range change, the second impedance device 321 continues, via the variable tap ($T_B$), to directly connect the input of the second amplifier buffer 319 with the output of the force amplifier 317 while also maintaining a high impedance between the input of the second amplifier buffer 319 and the output of the second amplifier buffer 319. The first impedance device 320 can begin to be controlled to decrease the impedance between the variable tap ($T_A$) and the output of the first amplifier buffer 318 while also increasing the impedance between the variable tap ($T_A$) and the output of the force amplifier 317.

Figure 3F:
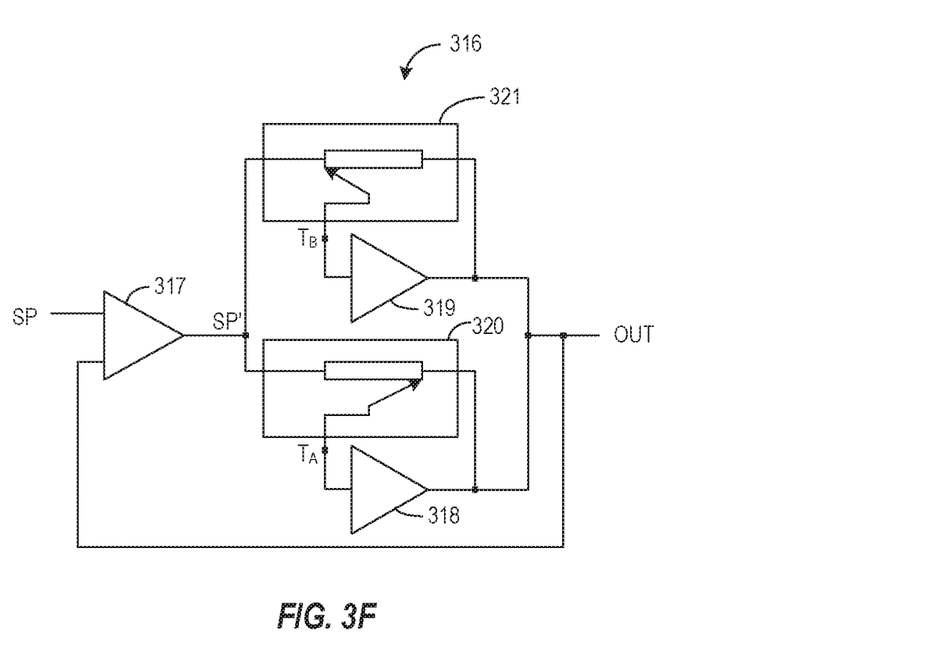

FIG. 3F illustrates generally a fifth state of the output circuit during the range change or at the conclusion of the range change. While reaching this fifth state of the range change, the second impedance device 321 continues, via the variable tap ($T_B$), to directly connect the input of the second amplifier buffer 319 with the output of the force amplifier 317 while also maintaining a high impedance between the input of the second amplifier buffer 319 and the output of the second amplifier buffer 319. The first impedance device 320 can be controlled to decrease the impedance between the variable tap ($T_A$) and the output of the first amplifier buffer 318 to a short circuit while also increasing the impedance between the variable tap ($T_A$) and the output of the force amplifier 317 to isolate the variable tap ($T_A$) from the output of the force amplifier 317. At the fifth state, the second amplifier buffer 319 can source all the current to the DUT and the first amplifier buffer 318 can be disabled. Because of the gradual integration of the operation of the second amplifier buffer 318 to enable a new range of output signal level, the DUT experiences little if any voltage glitch during the range change.

Figure 4:
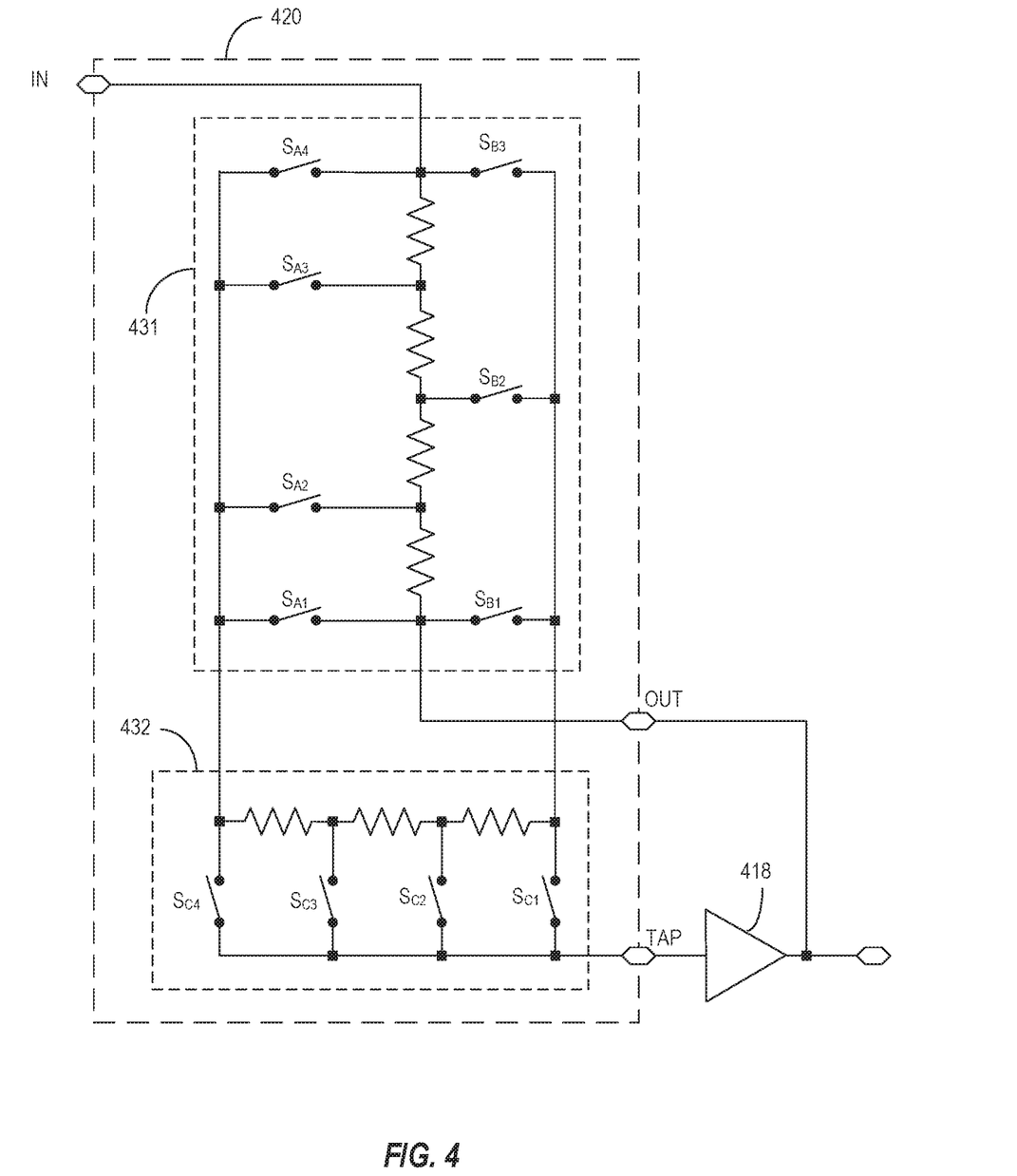
FIG. 4 illustrates generally an example impedance device coupled with amplifier.

FIG. 4 illustrates generally an example impedance device 420 coupled with amplifier 418. The impedance device 420 can include a first impedance string 431, a second impedance string 432, and three groups of switches ($S_{An}$, $S_{Bn}$, $S_{Cn}$). In certain examples, the first impedance string 431 can include a first node (IN) configured to receive an input signal for the amplifier 418, a second node (OUT) configured to couple with the output of the amplifier and one or more groups of the group of switches ($S_{An}$, $S_{Bn}$, $S_{Cn}$). In certain examples, the second impedance string 432 can include a group of switches ($S_{Cn}$) and the variable tap (TAP). The variable tap (TAP) can be coupled to the input of the amplifier 418. A first group of switches ($S_{An}$) can selectively couple a first end node of the second impedance string 432 with the first node (IN) of the first impedance string 431, the second node (OUT) of the first impedance string 431, and every other intermediate node of the first impedance string 431. A second group of switches ($S_{Bn}$) can selectively couple a second end node of the second impedance string 432 with the first node (IN) of the first impedance string 431, the second node (OUT) of the first impedance string 431, and every other intermediate node of the first impedance string 431 not configured to be selectively coupled to the first end node of the second impedance string 432.

In certain examples, during operation of an output circuit, the first node (IN) of the impedance device 420, or the first node of the first impedance string 431, can be coupled to the input signal, the second node (OUT) of the impedance device 420, or the second node of the first impedance string 431, can be coupled to the output of the amplifier 418, and the variable tap can be coupled to the input of the buffer amplifier as shown in FIG. 2. For an inactive amplifier of an output circuit, or just prior to being activated to change a range of the output signal of the output circuit, the input of the amplifier 418 can be shorted to the output of the amplifier via SC1 and SB1, or SCN and SA1, where N is an integer number greater than 2 and N=4 for the example of FIG. 4. During the next interval of the range change sequence, SC1 and SB1 can be closed, SA1 and SCN can be opened, and SA2 can be closed. During the next interval, SC1 can be opened and SC2 closed, and so on such that as the closed switch of the third group of switches ($S_{Cn}$) reaches an end switch (e.g., SC4), an end point of the second impedance string 432 furthest from the input signal can be opened and that end of the second impedance string 432 can be coupled to the next available node of the first impedance string 431 towards the input signal. Such a sequence operates to sequentially connect the variable tap (TAP) from isolating the first node (IN) from the input of the amplifier 418 to shorting the first node (IN) to the input of the amplifier 418. Simultaneously, such a sequence also operates to sequentially connect the variable tap (TAP) from shorting the second node (OUT) with the input of the amplifier 418 to isolating the second node (OUT) to the input of the amplifier 418. The sequence transitions the amplifier 418 from appearing as a large output impedance to directly connected to the input of the amplifier 418 with the input signal and fully amplifying or buffering the input signal to the output of the amplifier 418.

In certain examples, the procedure can be followed in reverse order to disable the amplifier 418 such that just before the amplifier is disabled, the input of the amplifier 418 is directly coupled to the output of the amplifier 418. It is understood that the number of terminals of the first impedance string and the second impedance string can be more or less than shown in the example of FIG. 4 without departing from the scope of the present subject matter.

Figure 5A:
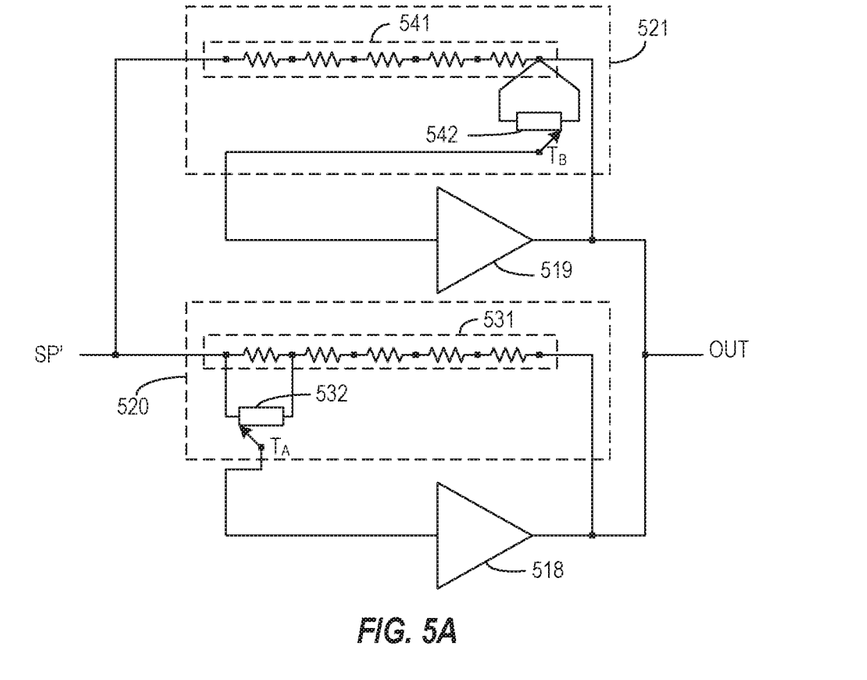
FIGS. 5A-5H illustrate generally the relative relationship of example first and second impedance strings during a range change.
Figure 5B:
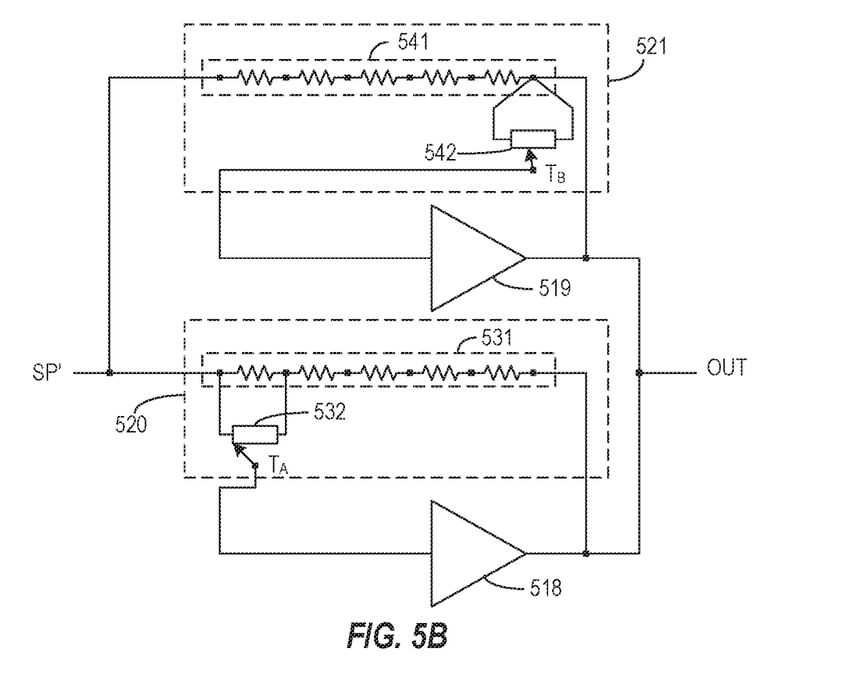
Figure 5C:
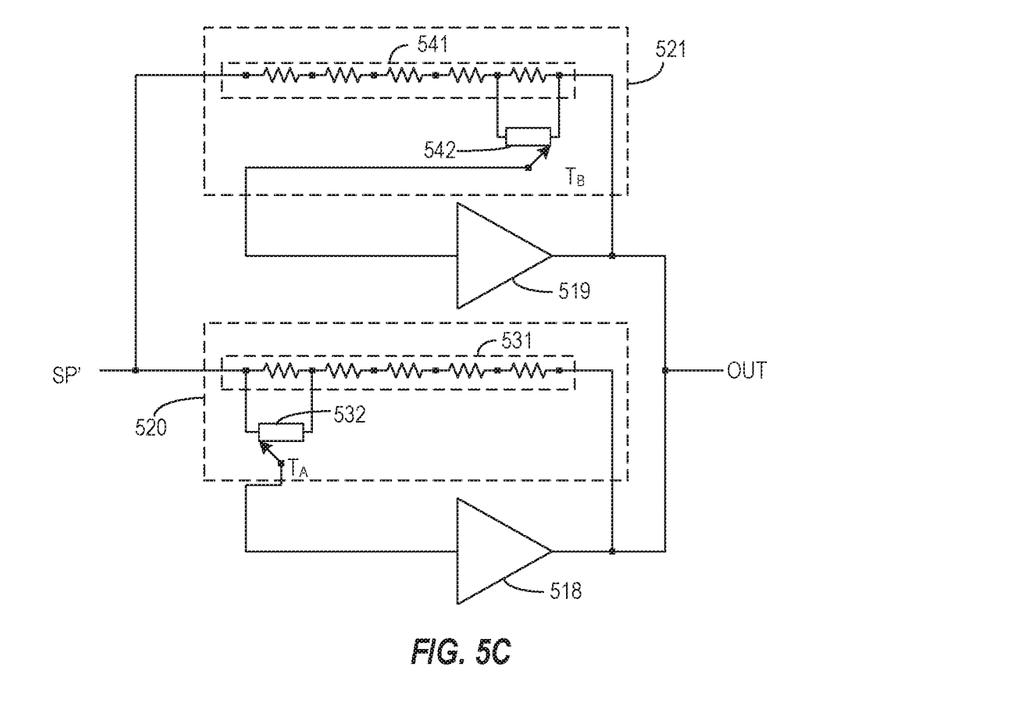

FIGS. 5A-5H illustrate generally the relative relationship of the first and second impedance strings during a range change. FIGS. 5A-5H include first and second amplifier buffers and first and second impedance devices. In certain examples, each amplifier buffer can provide a different range of levels for an output signal (OUT) based on a received set point (SP'). Each impedance device can include a first node to connect with the setpoint (SP'), a second node to connect with the output signal (OUT), and a variable tap ($T_A$, $T_B$) to connect with the corresponding amplifier buffer input. Each impedance device 520, 521 can include a first impedance string 531, 541 and as second impedance string 532, 542. FIG. 5A illustrates a first amplifier buffer 518 with a connected impedance device 520 in a state when the first amplifier buffer 518 is enabled and capable of providing a full range of output signal values. FIG. 5B illustrates the state of the impedance devices 520, 521 as the first amplifier buffer 518 is beginning to be disable, for example, to allow for another amplifier buffer, such as the second amplifier buffer 519, to provide a different range of values for the output signal (OUT). FIG. 5B shows the second impedance string 542 of the second impedance device 521 beginning to traverse the first impedance string 541. In addition, before the method has the second impedance string 542 further traverse the first impedance string 541, the viable tap ($T_B$) can sequentially traverses nodes of the second impedance string 542 to begin to directly couple the input signal (SP') with the input of the the second amplifier buffer 519 via the variable tap ($T_B$). FIG. 5C illustrates the second impedance string 542 of the second impedance device 521 selectively disconnecting an end node and reconnecting the end node to further traverse the first impedance string 541. Again, before the method has the second impedance string 542 further traverse the first impedance string 541, the viable tap ($T_B$) can sequentially traverses the nodes of the second impedance string 542 from one end to the other.

Figure 5D:
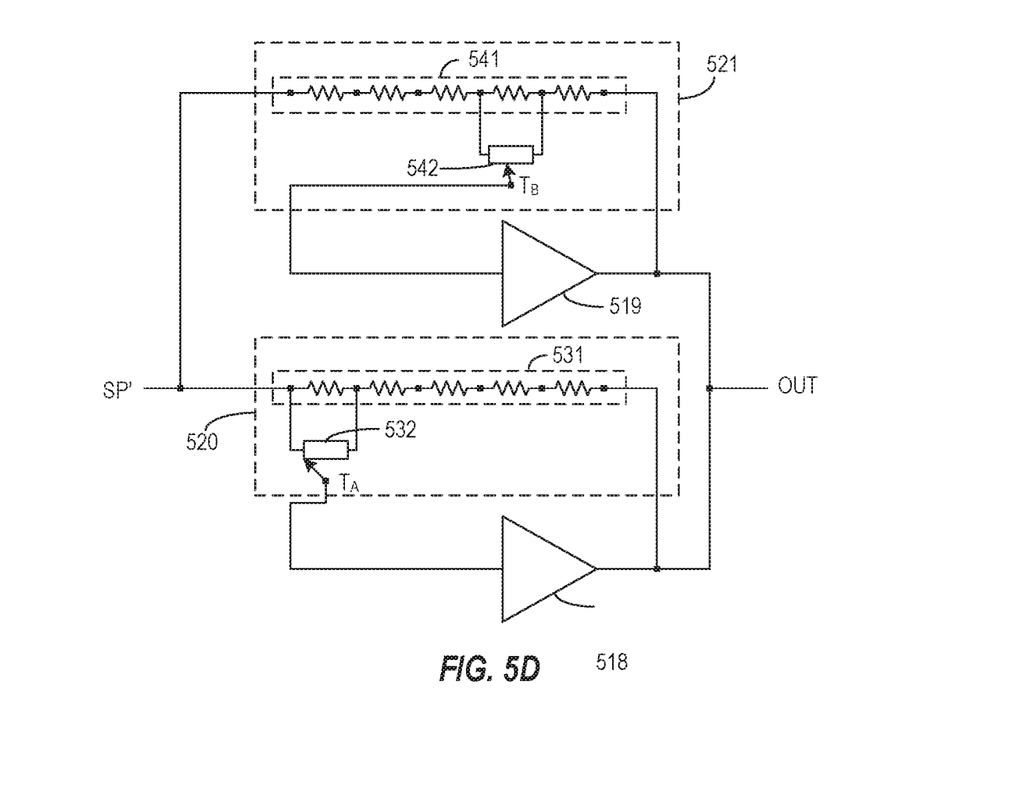
Figure 5E:
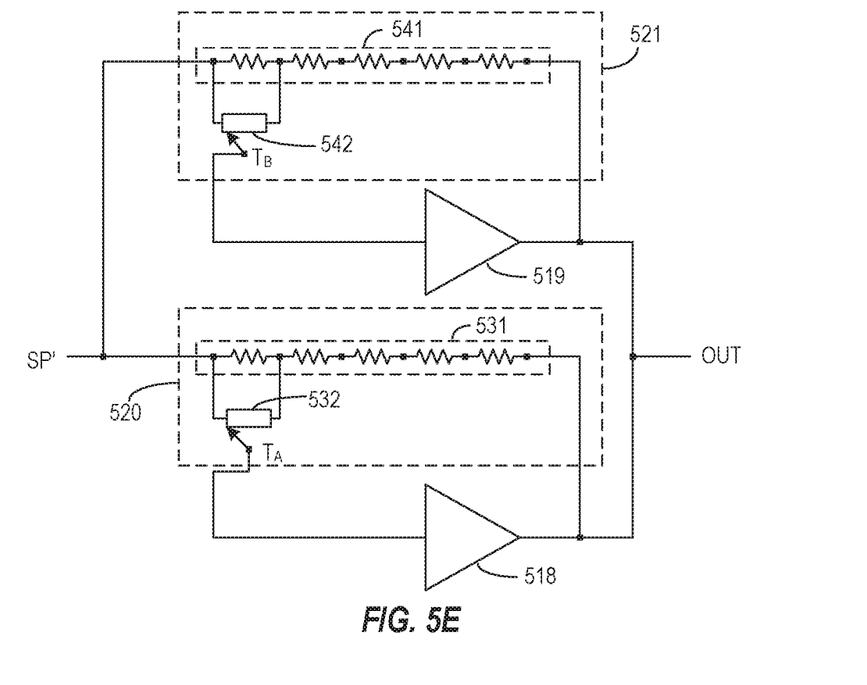

FIG. 5D illustrates the second impedance string 542 of the second impedance device 521 selectively disconnecting an end node and reconnecting the end node to further traverse the first impedance string 541. Again, before the method has the second impedance string 542 further traverse the first impedance string 541, the viable tap ($T_B$) sequentially traverses the nodes of the second impedance string 542 to reduce the impedance between setpoint (SP') and the input of the second amplifier buffer 519 and to increase the impedance between the input and the output of the second amplifier butler 519. FIG. 5E illustrates the second impedance string 542 of the second impedance device 521 selectively completing traversal of the first impedance string 541 and shorting the variable tap ($T_B$) with the set point (SP'), thus shorting the input of the second amplifier buffer 519 to the set point (SP') and isolating the input of the second amplifier buffer 519 from the output of the second amplifier buffer 519 via the first impedance string 541 of the second impedance device 521.

Figure 5F:
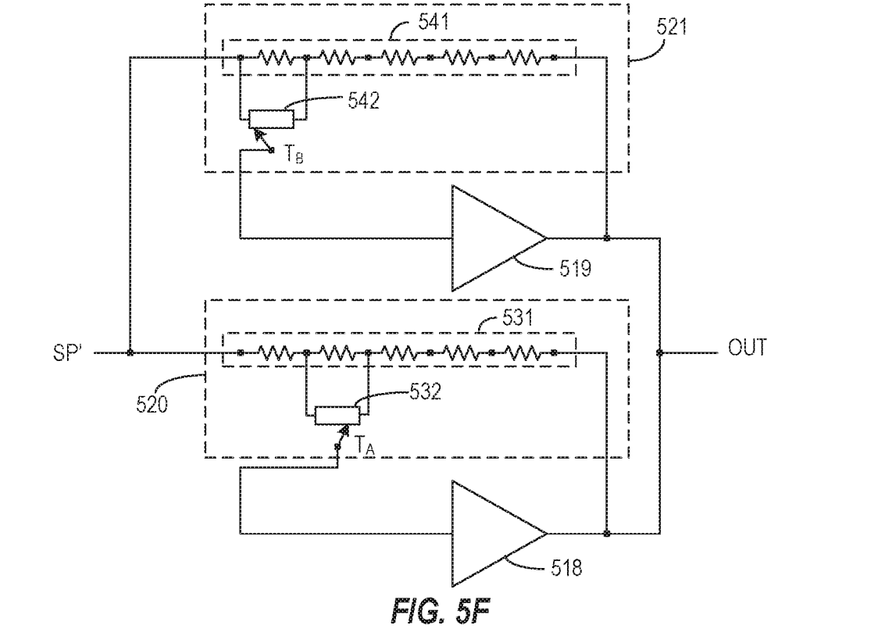

FIG. 5F illustrates generally the second impedance string 532 of the first impedance device 520 beginning to traverse the first impedance string 531 to begin removing or withdrawing the first amplifier butler 518 from affecting the output signal (OUT). As discussed above, before the second impedance string 532 of the first impedance device 520 begins to traverse the first impedance string 531, the variable tap ($T_A$) can sequentially switch nodes of the second impedance string 532 to begin increasing the impedance between the set point and the input of the first amplifier buffer 518 as well as also decreasing the impedance between the input of the first amplifier buffer 518 and the output of the first amplifier buffer 518.

Figure 5G:
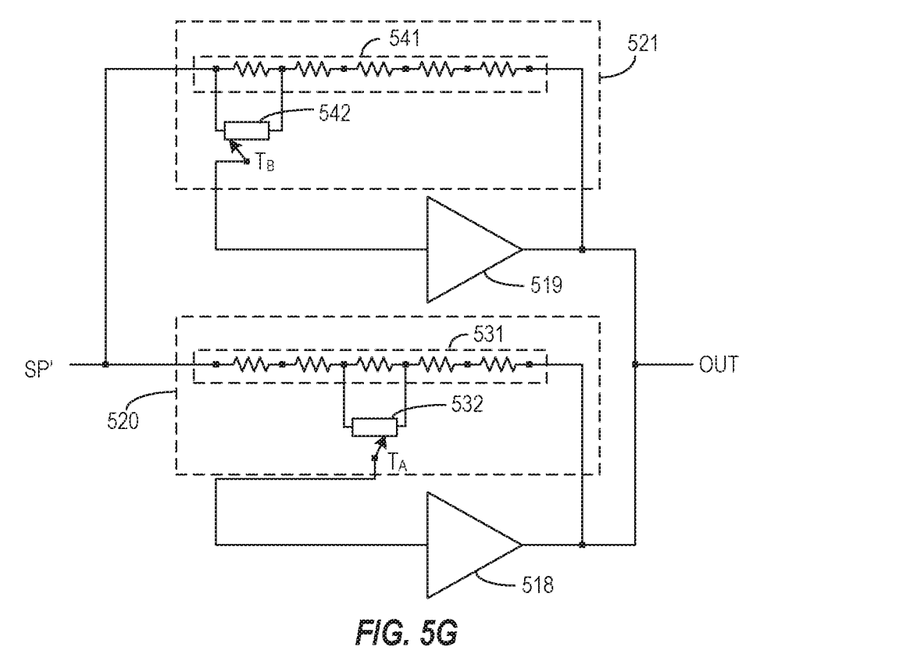
Figure 5H:
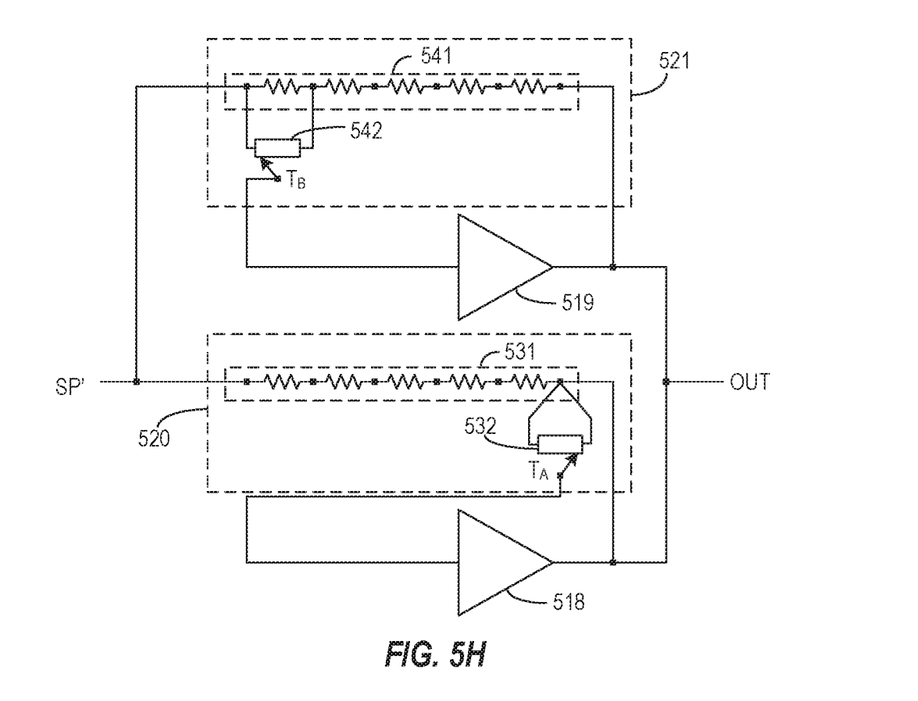

FIG. 5G illustrates the second impedance string 532 of the first impedance device 520 selectively disconnecting an end node and reconnecting the end node to further traverse the first impedance string 531 of the first impedance device 520. Again, before the method has the second impedance string 532 further traverse the first impedance string 531, the viable tap ($T_A$) sequentially traverses the nodes of the second impedance string 532 from one end to the other. FIG. 5H illustrates the second impedance string 532 of the first impedance device 520 selectively completing traversal of the first impedance string 531 and shorting the variable tap ($T_A$) with the output node (OUT), thus shorting the input of the first amplifier buffer 518 to the output of the first amplifier 518 and rendering the first amplifier 518 disabled with regards to the output signal (OUT).

Figure 6:
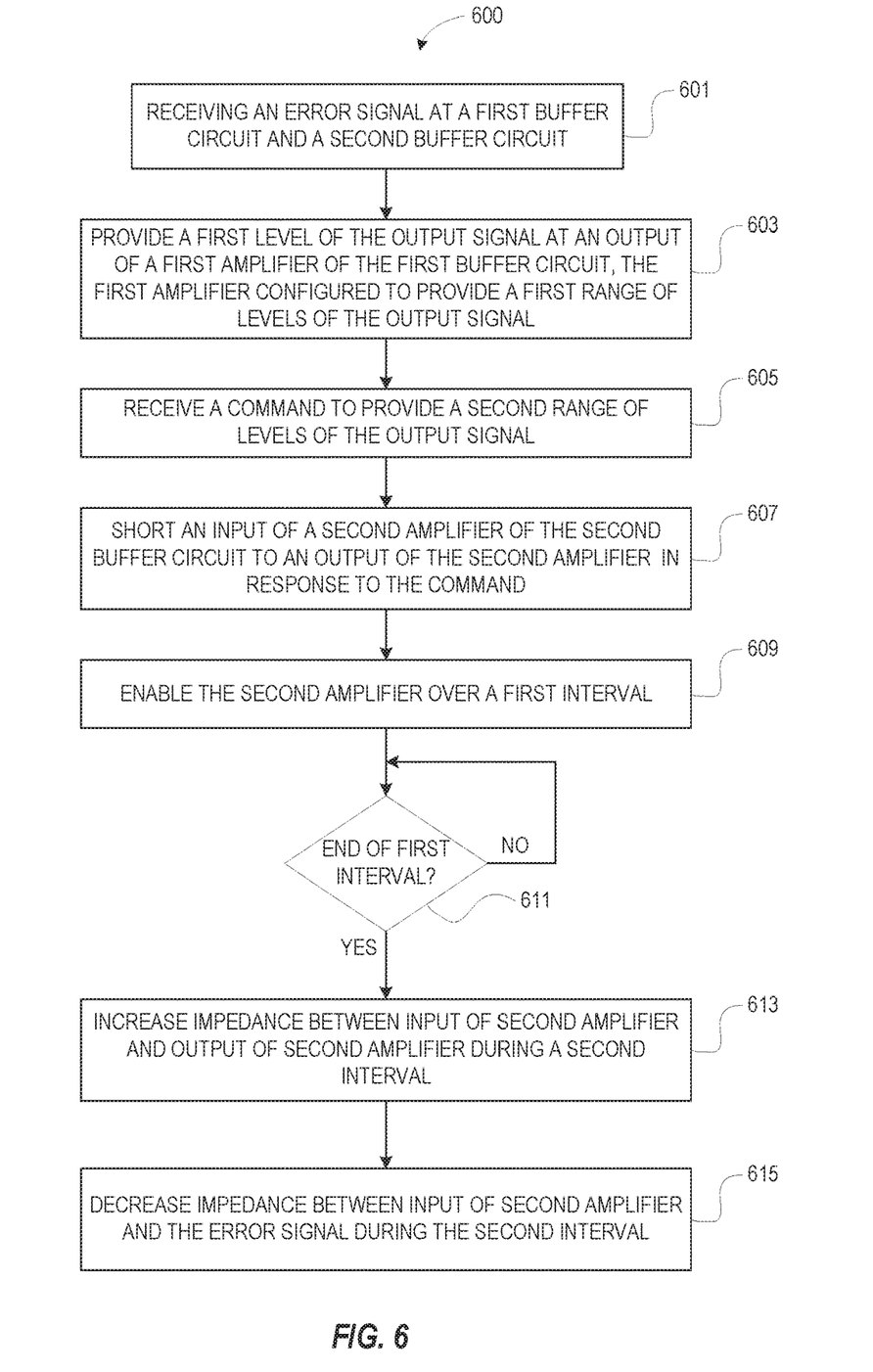
FIG. 6 illustrates generally a flowchart of an example method for changing a range of an output circuit.

FIG. 6 illustrates generally a flowchart of an example method 600 for changing a range of an output circuit such as an output circuit of a piece of test equipment. At 601, a signal, such as an error signal, can be received at one or more buffer circuits. Each buffer circuit can provide a different range of output signal levels. Although not limited as such, only one buffer circuit is active at most times. At 603, the active buffer circuit, or first buffer circuit, can provide an output signal at a level based on the error signal. At 605, a range command signal can be received that requests that the range of levels of the output signal be changed from the range provided by the first buffer circuit. At 607, in response to the range command signal, an input of an amplifier of a second buffer circuit can be shorted to the output of the amplifier of the second buffer circuit for a first interval. In certain examples, an impedance device such as the example of FIG. 4 can be used to provide the short circuit. In some examples, the amplifier of the second buffer circuit can be enabled at 609 during the first interval if not already enabled. When the first interval concludes at 611, at 613, impedance between the input of the amplifier and the output of the amplifier of the second buffer circuit can gradually increase over a second interval. At 615, after conclusion of the first interval, impedance between a terminal receiving the error signal and the input of the amplifier can decrease over the second interval.

As the above impedances of the second buffer circuit change, the second buffer circuit can begin to share sourcing of the output signal with the first buffer circuit. The output signal can be provided, for example, to a DUT. At the end of the second interval, the error signal can be coupled directly to the input of the amplifier of the second buffer circuit. After the conclusion of the second interval, the first buffer circuit can be withdrawn from operation by using an impedance device to change the impedances of the first buffer circuit in a opposite fashion as described above to activate the second buffer circuit. The present techniques can allow a range of an output circuit to be changed on-the-fly without introducing voltage glitches associated with differing voltage drops across different buffer circuits used to provide the different ranges. In certain examples, the rate at which one buffer circuit is activated and another buffer circuit is withdrawn from providing the output signal can depend on the voltage control loop bandwidth of the overall output system.

Figure 7:
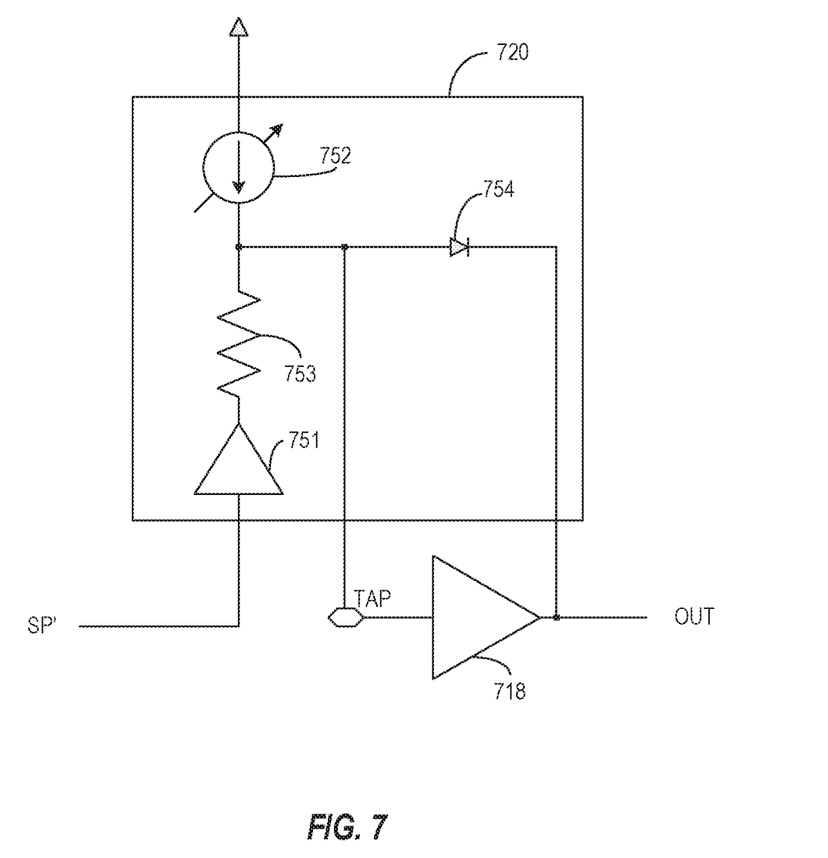
FIG. 7 illustrates an alternative example of a circuit for enabling or disabling an amplifier buffer.

FIG. 7 illustrates an alternative example of a circuit 720 for enabling or disabling an amplifier buffer 718. Such a circuit 720 can be used to adjust a range of an output signal on-the-fly with little or no glitch. The circuit 720 can include an input buffer 751, current source 752, an impedance 753, and a diode 754. The function of the circuit 720 is to move the level of the input (TAP) of the output buffer 718 between receiving the voltage of the setpoint signal (SP') and receiving the voltage at the output (OUT) of the output buffer amplifier 718. This description assumes the output amplifier buffer 718 is disabled as an initial condition such that no power is provided to the output amplifier buffer 718 or any other component of the circuit 720. To enable the amplifier buffer 718 to provide a different range on-the-fly with little or no glitch, power can be provided to the adjustable current source 752 and the current source can be adjusted to provide a fair amount of current such that the diode 754 is forward biased. The output amplifier buffer 718 can then be ramped up to power. As the output buffer amplifier 718 is ramped to power, the voltage at the input (TAP) of the output amplifier buffer 718 can be very near the voltage at the output (OUT) of the amplifier buffer 718. The output amplifier buffer 718 can now appear as a large impedance to the load connected to the output (OUT) of the output amplifier buffer 718.

The adjustable current source 752 can be ramped to provide a decreasing amount of current. As the current supplied by the current source 752 falls, the voltage at the input (TAP) of the output amplifier buffer 718 can slide towards the voltage at the setpoint (SP'). For example, once the current source 752 is adjusted to provide zero current, the voltage at the end of the resistor 753 coupled to the input (TAP) of the output amplifier buffer 718 can be the voltage of the setpoint (SP'). To disable the output amplifier buffer 718 with little or no glitch, the method described above can be reversed.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the tem is "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. An amplifier circuit configured to receive a test setpoint at a setpoint input and to provide a test signal to a device under test based on the test setpoint, the amplifier circuit comprising:
a first amplifier having an output configured to provide the test signal;
a first impedance device coupled between the setpoint input and the output of the first amplifier, the first impedance device including a first tap coupled to an input of the first amplifier; and
a control circuit configured to:
initiate a startup interval;
short circuit the first tap, via the first impedance device, to the output of the first amplifier at a first instance of the startup interval;
during the startup interval, after the first instance and via the first impedance device, increase impedance between the first tap and the output of the first amplifier; and
at a conclusion of the startup interval and via the first impedance device, short the first tap to the setpoint input.

2. The amplifier circuit of claim 1, wherein the first impedance device includes:
a first plurality of resistors coupled in series;
second plurality of resistors coupled in series and having a first endpoint termination and a second endpoint termination; and
a first set of switches to individually and selectively couple the first end termination and the second endpoint termination to a plurality of nodes of the first plurality of resistors; and
a second set of switches to selectively couple nodes of the second plurality of resistors to the first tap.

3. The amplifier circuit of claim 2, including a second amplifier having an output configured to provide the test signal.

4. The amplifier circuit of claim 3, wherein the first amplifier is configured to vary the test signal, based on the test setpoint, over a first range.

5. The amplifier circuit of claim 4, wherein the second amplifier is configured to vary the test signal, based on the test setpoint, over a second range, wherein the second range is different than the first range.

6. The amplifier circuit of claim 5, including a second impedance device coupled between the setpoint input and the output of the second amplifier, the second impedance device including a second tap coupled to an input of the second amplifier.

7. The amplifier circuit of claim 6, wherein the control circuit is configured to:
prior to the startup interval and via the second impedance device, short the second tap to the setpoint input; and
over a second interval, at the conclusion of the startup interval and via the second impedance device, increase impedance between the setpoint input and the second tap and decrease impedance between the second tap and the output of the second amplifier.

8. The amplifier circuit of claim 7, wherein the control circuit is configured to, at the conclusion of the second interval, short the second tap to the output of the second amplifier via the second impedance device.

9. The amplifier circuit of claim 8, wherein the control circuit is configured to, after the second tap is shorted to the output of the second amplifier, power down the second amplifier.

10. A method of changing a range of an output signal of a test probe, the method comprising:
receiving a setpoint signal at a first amplifier;
providing a first level of the output signal at an output of the first amplifier based on the setpoint signal, wherein the first amplifier is configured to provide a first range of levels of the output signal;
receiving a command to provide a second range of levels of the output signal;
shorting an input of a second amplifier to an output of the second amplifier in response to the command, wherein the output of the second amplifier is coupled to the output signal;
enabling the second amplifier during a first interval;
after a conclusion of the first interval, increasing a first impedance between the input of the second amplifier and the output of the second amplifier over a second interval; and
after the conclusion of the first interval, decreasing a second impedance between the input of the second amplifier and the setpoint signal over the second interval; and
wherein the second amplifier is configured to provide the second range of levels of the output signal.

11. The method of claim 10, including maintaining operation of the first amplifier during the first interval.

12. The method of claim 10, after conclusion of the second interval, disabling the first amplifier.

13. The method of claim 10, wherein increasing a first impedance between the input of the second amplifier and the output of the second amplifier over the second interval and decreasing a second impedance between the input of the second amplifier and the setpoint signal over the second interval includes using a single impedance device to increase the first impedance between the input of the second amplifier and the output of the second amplifier over the second interval and decrease the second impedance between the input of the second amplifier and the setpoint signal.

14. The method of claim 10, wherein increasing the first impedance and decreasing the second impedance includes traversing a plurality of resistors of a first string of resistors with end nodes of a second string of resistors.

15. The method of claim 14, wherein the second string of resistors includes one or more switches coupling a variable tap to an input of the second amplifier.

16. A circuit comprising:
a first amplifier configured to provide an output signal within a first range based on a setpoint received on a setpoint input of the circuit;
a second amplifier configured to provide the output signal within a second range based on the setpoint;
means for adjusting a first impedance between the setpoint input and an input of the second amplifier and a second impedance between the input of the second amplifier and an output of the second amplifier; and a controller configured to receive a range selection and to transition control of the output signal from the first amplifier to the second amplifier in response to a transition of the range selection; and wherein the controller is further configured to:
  enable the first amplifier to control the output signal prior to the transition;
  short an input of a second amplifier to the output of the second amplifier for a first interval in response to the transition;
  after conclusion of the first interval, control the means for adjusting a first impedance to increase a first impedance between the input of the second amplifier and the output of the second amplifier over a second interval; and
  after the conclusion of the first interval, control the means for adjusting a first impedance to decrease a second impedance between the input of the second amplifier and the setpoint over the second interval; and
  after conclusion of the second interval, disable the first amplifier.

17. The circuit of claim 16, wherein the means for adjusting the first impedance includes a first impedance device coupled between the input of the circuit and an output of the second amplifier, the first impedance device including a variable tap coupled to an input of the second amplifier.

18. The circuit of claim 17, including means for adjusting a third impedance between the setpoint input and an input of the first amplifier and a fourth impedance between the input of the first amplifier and an output of the first amplifier.

19. The circuit of claim 18, wherein, after conclusion of the second interval and before disabling the first amplifier, the controller is configured to:
  control the means for adjusting the third impedance to decrease the third impedance between the input of the first amplifier and the output of the first amplifier over a third interval; and
  control the means for adjusting the third impedance to increase the fourth impedance between the input of the first amplifier and the setpoint over the third interval.

20. The circuit of claim 18, wherein the means for adjusting the third impedance includes a second impedance device coupled between the input of the circuit and an output of the first amplifier, the second impedance device including a variable tap coupled to an input of the first amplifier.

* * * * *